United States Patent [19]
Kahl et al.

[11] Patent Number: 6,086,225
[45] Date of Patent: Jul. 11, 2000

[54] SURFACE MOUNT LAMP ASSEMBLY

[75] Inventors: John H. Kahl, Valencia; Joseph S. Velas, Westhills, both of Calif.

[73] Assignee: JKL Components Corporation, Pacoima, Calif.

[21] Appl. No.: 09/067,759

[22] Filed: Apr. 27, 1998

[51] Int. Cl.$^7$ ............................................. F21V 9/00
[52] U.S. Cl. ................... 362/293; 362/226; 362/437; 313/318.01
[58] Field of Search ............................ 362/255, 257, 362/293, 300, 307, 311, 326, 375, 226, 437, 441, 310; 313/317, 318.01, 318.03, 318.05

[56] References Cited

U.S. PATENT DOCUMENTS

| | | | |
|---|---|---|---|
| 2,905,807 | 9/1959 | Stevens | 362/293 |
| 3,286,089 | 11/1966 | Smith | 362/375 |
| 4,193,653 | 3/1980 | Aizawa | 439/57 |
| 4,781,960 | 11/1988 | Wittes | 361/767 |
| 5,209,668 | 5/1993 | Higano | 313/318.01 |
| 5,221,140 | 6/1993 | Oshino | 362/255 |
| 5,593,223 | 1/1997 | Koizumi | 362/255 |

*Primary Examiner*—Sandra O'Shea
*Assistant Examiner*—H. S. Sawhney
*Attorney, Agent, or Firm*—Edward E. Roberts

[57] ABSTRACT

A lamp assembly for mounting to a substrate having a housing formed, such as by molding, of a translucent silicone rubber with a cavity formed therein for receiving a miniature incandescent lamp with the leads thereof bent into the mounting plane to enable the lead to be utilized for mechanical and electrical bonding to the substrate. In one embodiment the housing has an enlarged base with a peripheral generally planar lip providing a pick-up surface for vacuum type tools. The base may be generally circular in cross-section with opposing sides of the peripheral flattened to provide indexing surfaces for mechanical orientation and handling devices. The enlarged base may be oval-shaped in cross-section and provided with spacing means adjacent the cavity, or may be rectangular in cross-section with V-shaped cut-outs on opposite edges for enabling protrusion of the leads into the slots so formed, thus providing protection for the leads during handling. The lamp housing may include axially disposed radially directed ribs configured and positioned for ease of insertion and frictional retention of the lamp and for limiting contact of the lamp with the housing for use with high temperature lamps.

17 Claims, 2 Drawing Sheets

U.S. Patent  Jul. 11, 2000  Sheet 1 of 2  6,086,225
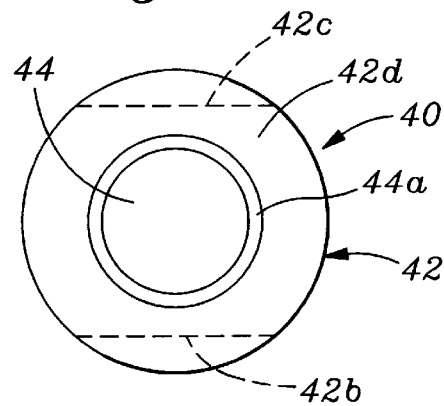
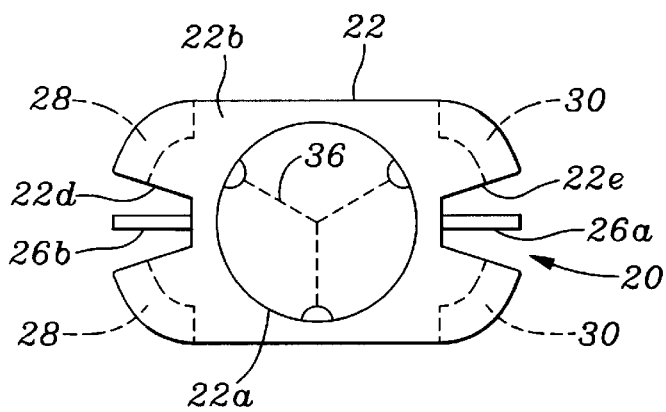
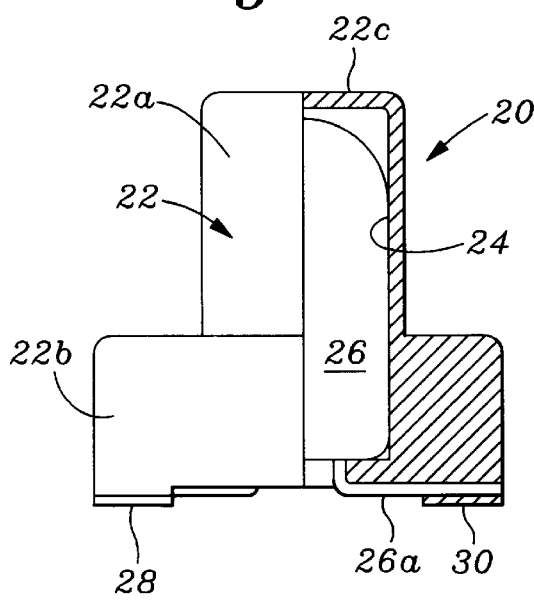
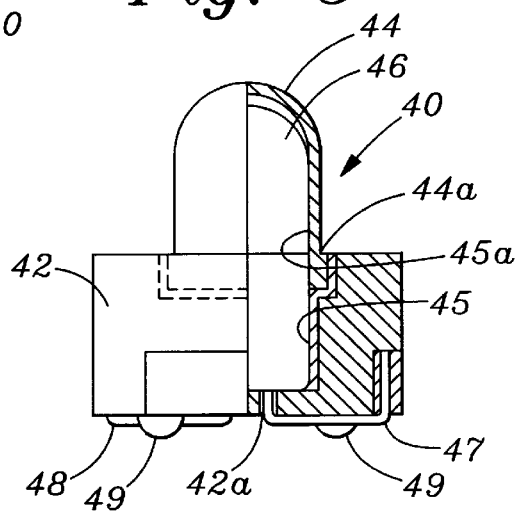
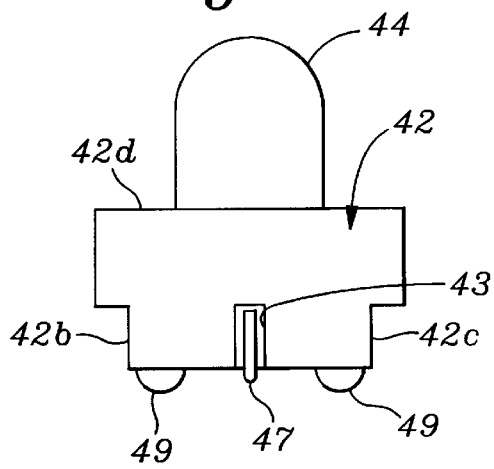

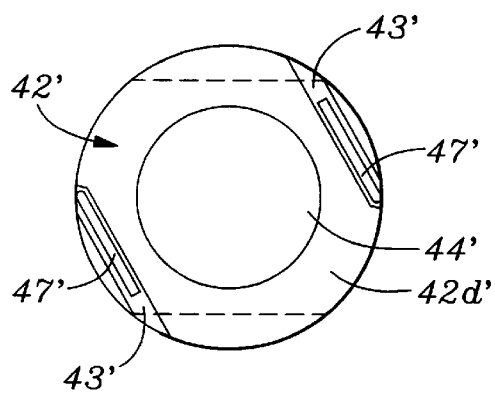
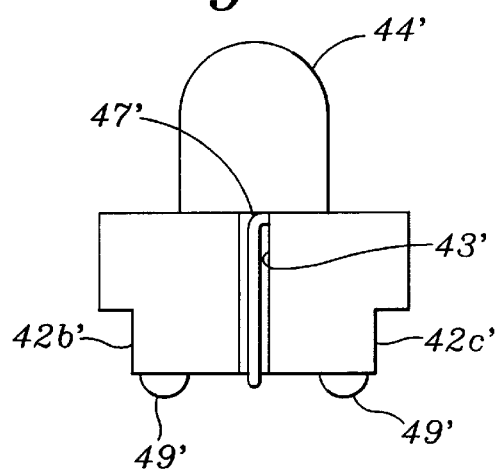
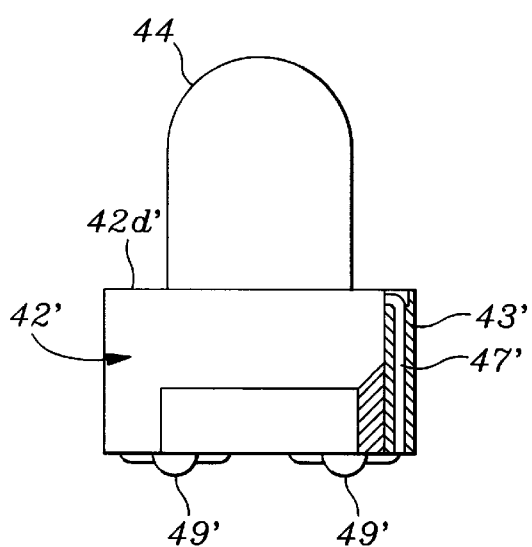
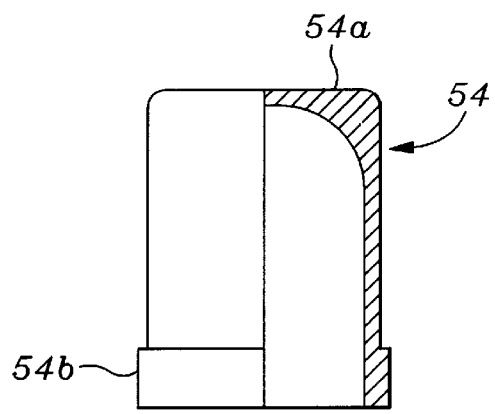
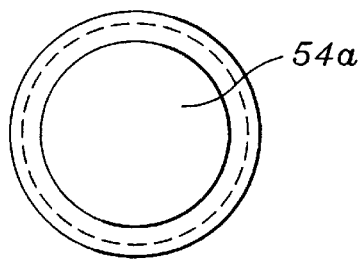
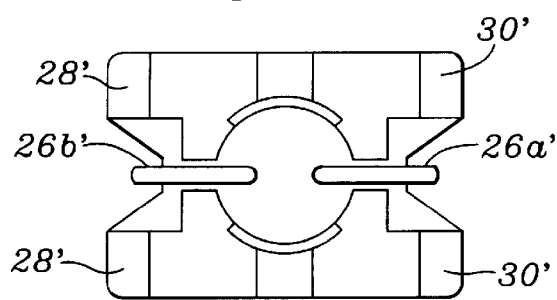

SURFACE MOUNT LAMP ASSEMBLY

BACKGROUND OF THE INVENTION

1. Field of the Invention

This invention relates to miniature lamps, and more particularly to a miniature lamp assembly especially suited for surface mount applications.

2. Description of the Prior Art

In modern printed circuit board construction, surface mount technology has moved to the forefront in mass production of electronic devices, components and sub-assemblies. Printed circuit boards are provided with conductive leads and mounting pads on the surface thereof. Components to be mounted to these printed circuit boards or substrates are normally conveyed by such devices as vibratory bins or hoppers, the function of which is to position, or index, the components in a preferred orientation at a station.

After movement to the proper station, the component is then placed on the substrate, such as a circuit board, by use of robotics, sometimes referred to as "pick and place" machines, which have vacuum nozzles configured for picking up an article such as the surface mount lamp assembly of the present invention.

After the board is "stuffed", that is, the board has all the required components thereon, the unit is then subjected to a bonding process, such as soldering at elevated temperatures, or the like. It therefore becomes apparent that such components are subjected to rigorous use and handling requirements, as well as mechanical and thermal stress.

Some prior art lamp assemblies, not necessarily surface mount assemblies, are shown and described in U.S. Pat. No. 4,193,653, issued Mar. 18, 1980 to Aizawa and U.S. Pat. No. 5,221,140, issued Jun. 22, 1993 to Oshino. U.S. Pat. No. 4,781,960, issued to Wittes on Nov. 1, 1988 relates to surface mount technology for mounting indicator lights on a printed circuit board. Such patents are considered representative of the prior art.

In accordance with an aspect of the invention, there is provided a surface mount lamp assembly configured and dimensioned for mechanical handling and bonding to a substrate at elevated temperatures.

SUMMARY OF THE INVENTION

In accordance with the invention there is provided a surface mount lamp assembly for mechanical and electrical connection to a substrate, such as a printed circuit board.

In a first embodiment, the assembly has a housing formed, such as by molding, of a translucent silicone rubber, the housing having a cavity formed therein for receiving a miniature incandescent lamp with the leads thereof bent into the mounting plane to enable the lead to be utilized for mechanical and electrical bonding to the substrate. The cavity may optionally be provided with inwardly extending longitudinal ribs, preferably 120 degrees apart, to assist in frictional retention of the lamp as well as to limit the lamp envelope contact with the silicone housing when used with high temperature gas filled lamps which may result in the silicone becoming brittle or having a wash out of color from pigment deterioration. The housing has an enlarged oval shaped base portion with a peripheral lip, indexing flat sides and V-shaped sections removed on opposite edges on the long axis thereof for enabling protrusion of the leads into the slots so formed, thus providing protection for the leads during handling. The closed portion of the housing has a generally planar surface for enabling vacuum pick-up. Alternatively the base may be of a rectangular configuration.

In a second embodiment the base is formed as a socket of high temperature thermosetting plastic material with the mounting surface of the base provided with a plurality of feet for permitting a space between the mounting surface and the substrate. A cup-shaped translucent filter is configured for enclosing the incandescent lamp placed in the socket, and, in one embodiment the filter includes a generally planar closed end to facilitate vacuum handling. The filter is provided with a flange for being received within a filter trough formed within the base. The base is provided with indexing flats on opposite sides for facilitating mechanical orientation and handling.

Other objects, features and advantages will become apparent on a reading of the specification when taken in conjunction with the drawings, in which like reference numerals refer to like elements in the several views.

BRIEF DESCRIPTION OF THE DRAWINGS

FIG. 1 is a side elevational view, partially in section, of a first embodiment of a surface mount lamp assembly according to the invention;

FIG. 2 is a top plan view of the lamp assembly invention of FIG. 1;

FIG. 3 is a side elevational view, partially in section, of a second embodiment of a surface mount lamp assembly according to the invention;

FIG. 4 is a view of the embodiment of FIG. 3, as viewed from the right side thereof;

FIG. 5 is a top plan view of the lamp assembly invention of FIG. 3;

FIG. 6 is a side elevational view, partially in section, of an alternate of the embodiment of the surface mount lamp assembly of FIG. 3;

FIG. 7 is a view of the embodiment of FIG. 6, as viewed from the right side thereof;

FIG. 8 is a top plan view of the lamp assembly invention of FIG. 6;

FIG. 9 is a side view, partially in section, of an alternate embodiment of lamp filter for use with the surface mount lamp assemblies of FIGS. 3 and 6;

FIG. 10 is a top plan view of the lamp filter of FIG. 9; and

FIG. 11 is an alternate bottom plan view of the lamp assembly invention of FIG. 1.

DESCRIPTION OF THE PREFERRED EMBODIMENT

Referring now to the drawings and particularly to FIGS. 1 and 2, there is shown a surface mount lamp assembly, generally designated 20. The lamp housing, generally designated 22, is shown formed as an inverted cup-shaped member 22a with an annular cross-sectional configuration integrally formed with an enlarged base portion 22b having an egg-shaped, or ovoid, configuration. The base portion may also be formed of a rectangular configuration (see FIG. 11).

An open bottom permits access to the cavity 24 for enabling insertion therein of a miniature incandescent lamp 26. The housing 22 is molded from a translucent silicone rubber material and is provided with a generally planar or flat top 22c which serves as a vacuum pick-up area. The body portion 22b is also provided with an enlarged flange portion and a pair of oppositely disposed generally V-shaped cut-outs 22d and 22e at opposite edges of the flange portion in alignment with the long axis, or major axis, of the oval-shaped flange.

As shown in FIG. 1, the two leads 26a and 26b of the lamp 26 are directed outwards into the cut-outs 22e and 22d, respectively, in a plane generally parallel to the plane of the flange portion of the base portion at the underside thereof. The lead associated with each cut-out terminates within the outer limit of the cut-out to provide protection for the lead during mechanical, as well as manual, handling of the assembly.

The underside of the housing 22 is provided with two pair of feet 28 and 30 formed as arcuate sections at opposites sides of the cut-outs 22d and 22e. The feet 28 and 30 provide spacing between the substrate (not shown) and the lamp mount assembly 20 for enabling post soldering cleaning of residual material.

Although the housing 22 is formed of silicone rubber, the tolerance of the cavity 24 may be relaxed to allow for variations in diameter of the lamp 26. For enabling retention of the lamp 26 within the cavity 24, axially disposed, radially directed ribs 36 may be provided as indicated in dotted lines 36 in FIG. 2 for frictionally retaining the lamp 26 therein while reducing the effort required for insertion of the lamp 2 into the cavity 24. The ribs additionally serve to limit the lamp envelope contact with the silicone housing when used with high temperature gas filled lamps which may result in the silicone becoming brittle or having a wash out of color from pigment deterioration.

The housing 22, with the exception of the base portion 22b. is formed with a generally uniform wall thickness for providing generally uniform light transmission from the lamp 26 in operation.

The lamp assembly 20 of FIGS. 1 and 2 has the leads 28 and 30 configured and arranged for providing both mechanical and electrical bonding of the lamp to the circuit board or substrate. This eliminates additional attachments such as metal tabs or feet to which the leads would be bonded, thus simplifying the lamp construction while improving reliability by fewer components, that is, two components in this embodiment.

FIGS. 3 through 5 depict an alternate embodiment of a surface mount lamp assembly, generally designated 40, which is a three part assembly formed of a plastic base 42, a translucent filter 44 and a miniature lamp 46. The base 42 is essentially a cylindrically configured socket formed of a high temperature thermosetting plastic material with a recess 45 into which the lamp 46 is inserted with the bottom of the socket including apertures 42a through which the leads 47, 48 are inserted. The recess 45 is formed as a stepped circular opening, with the upper step portion 45a having a larger diameter to form a filter stop.

The filter 44 is configured as a cup-shaped translucent member having a slightly larger filter flange portion 44a configured for being received in and on the step portion 45a. The inner cavity of the filter 44 generally conforms to the shape of the envelope of the lamp 46. The base 42 has a large peripheral lip surface 42d which is generally planar and serves as a vacuum pick-up surface. The opposite sides 42b, 42c of the base 42 are flattened surfaces parallel to one another, these sides serving as indexing, or alignment surfaces during robotic handling during the board assembly process. The perimeter of the base 42 is provided with axially extending recesses or grooves disposed 180 degrees apart, such as groove 43, only one of which is shown, these grooves having the leads bent to fit therein. To facilitate post-soldering clean-up, the base 42 is also provided with spacers, or feet 49.

The embodiment of FIGS. 6 through 8 is similar in construction to that of FIGS. 3 through 5, in that they are both of three piece construction. The main difference between the two embodiments is in the location and placement of the leads of the lamp 46. In this embodiment, reference numerals for like parts bear the same numerals as the embodiment of FIGS. 3 through 5, and a detailed explanation thereof is unnecessary. The changed aspects will bear the same numerals followed by a prime (').

The base 42' has the grooves 43' axially extending upwards and then laterally along the base of the peripheral lip surface 42d' so that the leads 47' of the lamp 46 extend radially outwards along the underside of the base 42', then upwards within the axial portions of grooves 43' then along the grooves in the top lip 42d' of the base, thus essentially wrapping around the base 42'. In both embodiments the leads are exposed at the periphery of the base to allow for soldering, while the recesses into which the leads are positioned protect the leads during handling in the pick and place machines.

FIGS. 9 and 10 depict an alternate embodiment 54 for use with the filter 44 shown in FIGS. 3 and 6, which is of an inverted cup-shaped configuration. The inside cavity is configured to match the shape of the envelope of the lamp. However, the closed end 54a is flat, rather than rounded. With this flat surface there is provided an additional vacuum pick-up surface, that is, in addition to the lip 42d of the base 42.

FIG. 11 depicts an alternate bottom plan view of the lamp assembly invention of FIG. 1, wherein the base is constructed in a rectangular configuration.

In the surface mount lamp assemblies according to the present invention, the assemblies are quite small in dimension. Typically, by way of example, the outer diameter of the filter would be about 5 mm, with the overall height of the assembly about 10 mm. The width of the filter would be somewhat between 8 and 10 mm. Such assemblies, while quite small, need not be fragile if constructed in accordance with the embodiments of the present invention.

While there have been shown and described preferred embodiments, it is to be understood that various other modifications may be made within the scope of the invention.

What is claimed is:

1. A lamp assembly for mounting to a substrate, said assembly comprising:
   a lamp having at least two leads extending therefrom;
   a housing including a cavity formed therein configured for receiving said lamp with the leads extending from the opening thereof, said housing having an inverted cup-shaped member formed of translucent silicone rubber mounted onto and integrally formed with an enlarged base portion extending from said cup-shaped member and having diametrically opposed cut-outs, the leads being formed to extend into the area of said cut-outs for enabling attachment of the leads to substrate pads for providing electrical and mechanical connection to the substrate; and
   wherein said base portion is oval-shaped in cross-section and is provided with spacing means on the surface adjacent the cavity opening.

2. The assembly according to claim 1 wherein said cut-outs are generally V-shaped and the lead associated with each cut-out terminates within the outer limit of the cut-out to provide protection for the lead during handling of the assembly.

3. The assembly according to claim 1 wherein said cut-outs are generally V-shaped and positioned along the major axis of the oval, the lead associated with each cut-out terminating within the outer limit of the cut-out to provide protection for the lead during handling of the assembly.

4. The assembly according to claim 1 wherein said housing includes a flat surface at the closed end of the cavity formed therein for providing a pick-up surface for vacuum type tools.

5. A lamp assembly for mounting to a substrate, said assembly comprising:

a lamp having at least two leads extending therefrom;

a housing including a cavity formed therein configured for receiving said lamp with the leads extending from the opening thereof said housing having an inverted cup-shaped member formed of translucent silicone rubber mounted onto and integrally formed with an enlarged base portion extending from said cup-shaped member and having diametrically opposed cut-outs, the leads being formed to extend into the area of said cut-outs for enabling attachment of the leads to substrate pads for providing electrical and mechanical connection to the substrate; and wherein said base portion is rectangular in cross-section, is provided with spacing means on the surface adjacent the cavity opening, and said cut-outs are generally V-shaped and positioned along the major axis of the rectangle, the lead associated with each cut-out terminating within the outer limit of the cut-out to provide protection for the lead during handling of the assembly.

6. A lamp assembly for mounting to a substrate, said assembly comprising:

a lamp having at least two leads extending therefrom;

a housing including a cavity formed therein configured for receiving said lamp with the leads extending from the opening thereof, said housing having an inverted cup-shaped member formed of translucent silicone rubber mounted onto and integrally formed with an enlarged base portion extending from said cup-shaped member and having diametrically opposed cut-outs, the leads being formed to extend into the area of said cut-outs for enabling attachment of the leads to substrate pads for providing electrical and mechanical connection to the substrate; and wherein said housing includes axially disposed radially directed inwardly extending longitudinal ribs configured and positioned for ease of insertion and frictional retention of said lamp within said housing.

7. A lamp assembly for mounting to a substrate, said assembly comprising:

a lamp having at least two leads extending therefrom;

a housing including a cavity formed therein configured for receiving said lamp with the leads extending from the opening thereof, said housing having an inverted cup-shaped member formed of translucent silicone rubber mounted onto and integrally formed with an enlarged base portion extending from said cup-shaped member and having diametrically opposed cut-outs the leads being formed to extend into the area of said cut-outs for enabling attachment of the leads to substrate pads for providing electrical and mechanical connection to the substrate; and wherein said housing includes axially disposed radially directed inwardly extending longitudinal ribs configured and positioned for limiting contact of said lamp with said housing for use with high temperature lamps.

8. A lamp assembly for mounting to a substrate, said assembly comprising:

a lamp having at least two leads extending therefrom;

a base formed of plastic material, said base including a recess formed therein with a stepped portion and a pair of apertures in the closed end thereof, said base also including first and second grooves formed in the outer surface thereof, said recess being configured for receiving the base of the lamp therein with the leads extending through said apertures with said leads being formed for terminating within said grooves;

a filter configured and dimensioned for enclosing the other end of said lamp with the filter having an enlarged flange portion for being matingly received within said step portion from the opening thereof, said assembly also including an enlarged base portion having diametrically opposed cut-outs, the leads being formed to extend into the area of said cut-outs for enabling attachment of the leads to substrate pads for providing electrical and mechanical connection to the substrate;

said base includes a large peripheral lip surface which is generally planar for providing a pick-up surface for vacuum type tools; and said base is generally circular in cross-section and opposing sides of the periphery thereof are flattened for providing indexing surfaces for mechanical handling devices.

9. The assembly according to claim 8 wherein said recess is generally circular in cross-section and said stepped portion is of a larger diameter adjacent the opening of said recess.

10. The assembly according to claim 9 wherein said filter is configured as a cup-shaped translucent member having a filter flange portion configured for being received in and on said stepped portion.

11. The assembly according to claim 8 wherein said base is generally circular in cross-section and said grooves are formed in the outer surface extending in a direction parallel to the axis of said base.

12. The assembly according to claim 11 wherein said grooves further extend into the peripheral lip and the leads are wrapped around said base portion into said grooves.

13. The assembly according to claim 8 wherein said filter includes a flat surface at the closed end thereof for providing a pick-up surface for vacuum type tools.

14. The assembly according to claim 8 wherein said base is formed as a socket of high temperature thermosetting plastic material with the mounting surface of said assembly provided with a plurality of feet for permitting a space between said mounting surface and a substrate to which the assembly is mounted.

15. A lamp assembly for mounting to a substrate, said assembly comprising a lamp having at least two leads extending therefrom; and a housing including a cavity formed therein configured for receiving said lamp with the leads extending from the opening thereof, said housing having an inverted cup-shaped member formed of translucent silicone rubber mounted onto and integrally formed with an enlarged base portion extending from said cup-shaped member and having diametrically opposed cut-outs, the leads being formed to extend into the area of said cut-outs for enabling attachment of the leads to substrate pads for providing electrical and mechanical connection to the substrate, and said base portion is oval-shaped in cross-section and provided with spacing means on the surface adjacent the cavity opening.

16. A lamp assembly for mounting to a substrate, said assembly comprising a lamp having at least two leads extending therefrom;

a housing including a cavity formed therein configured for receiving said lamp with the leads extending from the opening thereof said housing having an inverted cup-shaped member formed of translucent silicone rubber mounted onto and integrally formed with an enlarged base portion extending from said cup-shaped member and having diametrically opposed cut-outs, the leads being formed to extend into the area of said cut-outs for enabling attachment of the leads to substrate pads for providing electrical and mechanical connection to the substrate, and wherein said base portion is rectangular in cross-section, is provided with spacing means on the surface adjacent the cavity opening, and said cut-outs are generally V-shaped and positioned along the major axis of the rectangle, the lead associated with each cut-out terminating within the outer limit of the cut-out to provide protection for the lead during handling of the assembly.

17. A lamp assembly for mounting to a substrate, said assembly comprising lamp having at least two leads extending therefrom; and a housing including a cavity formed therein configured for receiving said lamp with the leads extending from the opening thereof, said housing having an inverted cup-shaped member formed of translucent silicone rubber mounted onto and integrally formed with an enlarged base portion extending from said cup-shaped member and having diametrically opposed cut-outs, the leads being formed to extend into the area of said cut-outs for enabling attachment of the leads to substrate pads for providing electrical and mechanical connection to the substrate, said housing further including axially disposed radially directed ribs configured and positioned for ease of insertion and frictional retention of said lamp within said housing and for limiting contact with said housing for use with high temperature lamps.

* * * * *